(12) United States Patent
Cheng et al.

(10) Patent No.: US 10,797,080 B2
(45) Date of Patent: Oct. 6, 2020

(54) THIN FILM TRANSISTOR, ARRAY SUBSTRATE AND DISPLAY DEVICE

(71) Applicant: BOE TECHNOLOGY GROUP CO., LTD., Beijing (CN)

(72) Inventors: Hongfei Cheng, Beijing (CN); Yong Qiao, Beijing (CN); Jianbo Xian, Beijing (CN); Wenbo Li, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/179,354

(22) Filed: Nov. 2, 2018

(65) Prior Publication Data
US 2019/0088686 A1    Mar. 21, 2019

Related U.S. Application Data

(63) Continuation of application No. 14/570,312, filed on Dec. 15, 2014, now Pat. No. 10,163,935.

(30) Foreign Application Priority Data

Jun. 17, 2014  (CN) .................... 2014 2 0323542 U

(51) Int. Cl.
*H01L 27/12* (2006.01)
*H01L 29/423* (2006.01)
(Continued)

(52) U.S. Cl.
CPC .... *H01L 27/1222* (2013.01); *H01L 29/41733* (2013.01); *H01L 29/42384* (2013.01); *H01L 29/78648* (2013.01); *H01L 29/78696* (2013.01)

(58) Field of Classification Search
CPC .......... H01L 27/1222; H01L 29/41733; H01L 29/78696; H01L 29/42384; H01L 29/78648
See application file for complete search history.

(56) References Cited

U.S. PATENT DOCUMENTS

| 7,825,413 B2* | 11/2010 | Kim | .................. G02F 1/136209 |
| | | | 257/59 |
| 2004/0126950 A1* | 7/2004 | Kim | .................. H01L 29/66765 |
| | | | 438/197 |

(Continued)

*Primary Examiner* — Victor A Mandala
(74) *Attorney, Agent, or Firm* — Nath, Goldberg & Meyer; Joshua B. Goldberg

(57) ABSTRACT

The present invention provides a thin film transistor, an array substrate and a display device. The thin film transistor includes an active layer, a source electrode and a drain electrode. The active layer includes a source electrode contact region, a drain electrode contact region, and a semiconductor channel region arranged therebetween. A conductive layer is provided on the semiconductor channel region and is spaced apart from the source electrode and the drain electrode. The semiconductor channel region is U-shaped when viewed in a plane view of the pixel thin film transistor, and the source electrode includes a U-shaped part corresponding to the U-shaped semiconductor channel region. The conductive layer includes at least one conductive part, and the at least one conductive part is arranged between one end of the drain electrode and the U-shaped part of the source electrode.

17 Claims, 2 Drawing Sheets

(51) Int. Cl.
*H01L 29/786* (2006.01)
*H01L 29/417* (2006.01)

(56) References Cited

U.S. PATENT DOCUMENTS

| | | | |
|---|---|---|---|
| 2006/0289867 A1* | 12/2006 | Lim | H01L 29/42384 257/59 |
| 2007/0262316 A1* | 11/2007 | Kim | H01L 27/1214 257/72 |
| 2007/0275518 A1 | 11/2007 | Wang | |
| 2008/0135846 A1 | 6/2008 | Shin et al. | |
| 2008/0284929 A1 | 11/2008 | Kimura | |
| 2008/0296665 A1* | 12/2008 | Peng | G03F 1/00 257/327 |
| 2011/0057918 A1 | 3/2011 | Kimura et al. | |
| 2011/0198584 A1 | 8/2011 | Yang et al. | |
| 2012/0058598 A1* | 3/2012 | Yamazaki | H01L 21/02554 438/104 |
| 2012/0062814 A1* | 3/2012 | Yamazaki | G02F 1/136213 349/43 |
| 2013/0056835 A1 | 3/2013 | Tessler et al. | |
| 2013/0140556 A1* | 6/2013 | Park | H01L 29/78693 257/43 |
| 2013/0334528 A1* | 12/2013 | Miyamoto | H01L 29/26 257/43 |
| 2014/0071366 A1* | 3/2014 | Zhao | G02F 1/136286 349/43 |
| 2014/0084281 A1 | 3/2014 | Yeh et al. | |
| 2014/0084293 A1* | 3/2014 | Ahn | H01L 29/41733 257/59 |
| 2014/0291686 A1* | 10/2014 | Wang | H01L 29/41733 257/59 |
| 2015/0138475 A1* | 5/2015 | Kohara | H01L 27/1225 349/43 |

\* cited by examiner

THIN FILM TRANSISTOR, ARRAY SUBSTRATE AND DISPLAY DEVICE

CROSS-REFERENCE TO RELATED APPLICATIONS

This patent application is a continuation of U.S. patent application Ser. No. 14/570,312 filed on Dec. 15, 2014, entitled THIN FILM TRANSISTOR, ARRAY SUBSTRATE AND DISPLAY DEVICE, which claims priority to Chinese Patent Application No. CN 201420323542.8 filed on Jun. 17, 2014, the content of each of which is hereby incorporated by reference in its entirety.

FIELD OF THE INVENTION

The present invention relates to the field of display technology, and particularly to a thin film transistor, an array substrate and a display device.

BACKGROUND OF THE INVENTION

Display technology has been widely applied in a television, a mobile phone and display of public information, and currently, liquid crystal display panel and organic light-emitting display (OLED) panel are most widely used.

Both the liquid crystal display panel and the OLED panel include an array substrate and a display unit formed on the array substrate. The array substrate includes a plurality of thin film transistors. In a liquid crystal pixel circuit, the thin film transistor functions as a switch. In driving an OLED, the thin film transistor functions as both a switch and a driver. In the prior art, when the thin film transistor serves as a driving transistor, its drive capability is in positive correlation with conductivity of an active layer of the thin film transistor. The active layer is made of a semiconductor material whose conductivity is relatively low as compared to a conductive material. Therefore, it is of great importance to enhance the conductivity of the active layer.

SUMMARY OF THE INVENTION

In view of the problem that the active layer of the existing thin film transistor has poor conductivity, the technical problem to be solved by the present invention includes providing a thin film transistor with improved conductivity, an array substrate including the thin film transistor and a display device including the array substrate.

According to an aspect of the present invention, there is provided a thin film transistor, which includes an active layer, a source electrode and a drain electrode, and the active layer includes a source electrode contact region and a drain electrode contact region, and a semiconductor channel region arranged between the source electrode contact region and the drain electrode contact region. A conductive layer is provided on the semiconductor channel region and is spaced apart from the source electrode and the drain electrode.

Since the conductive layer is provided on the semiconductor channel region of the active layer of the thin film transistor according to the present invention, when a voltage is applied to the gate, charges with a polarity opposite to charges of the gate will be induced at a side of the conductive layer close to the gate, and therefore an electric field may be formed between the gate and the conductive layer, thus enhancing the electric field in the active layer to strengthen the conductivity of the semiconductor channel region and make the conductivity of the thin film transistor better.

According to an embodiment of the present invention, a material of the active layer may be any one of amorphous silicon, polycrystalline silicon, microcrystalline silicon, and oxide semiconductor.

According to an embodiment of the present invention, the active layer may further include an ohmic contact layer, and the source electrode, the drain electrode and the conductive layer may be in contact with the source electrode contact region, the drain electrode contact region and the semiconductor channel region through the ohmic contact layer, respectively.

According to an embodiment of the present invention, the conductive layer may be a metal conductive layer. The source electrode, the drain electrode, and the conductive layer may be provided in the same layer and made of the same material.

According to an embodiment of the present invention, a material of the source electrode, the drain electrode, and the conductive layer may be any one of Mo, Mo—Nb alloy, Al, Al—Nd alloy, Ti and Cu.

According to an embodiment of the present invention, the semiconductor channel region may be rectangle shaped or U-shaped.

According to an embodiment of the present invention, the conductive layer may include one or more conductive parts.

According to an embodiment of the present invention, the thin film transistor may further include a gate which is arranged above or below the active layer and is spaced apart from the active layer by a gate insulation layer.

According to another aspect of the present invention, there is provided an array substrate, which includes the thin film transistor according to the present invention.

According to another aspect of the present invention, there is provided a display device, which includes the array substrate according to the present invention.

DETAILED DESCRIPTION OF THE EMBODIMENTS

In order to make a person skilled in the art better understand the technical solutions of the present invention, the present invention will be further described in detail below in conjunction with the accompanying drawings and specific implementations.

Figure 1:
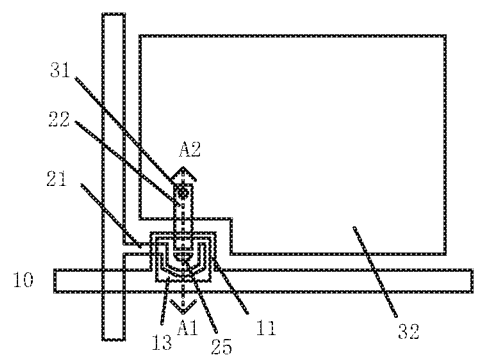
FIG. 1 is a schematic diagram of a structure of an array substrate including a thin film transistor according to an embodiment of the present invention.
Figure 2:
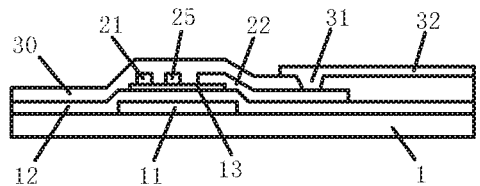
FIG. 2 is a sectional view taken along line A1-A2 of FIG. 1.

FIG. 1 is a schematic diagram of a structure of an array substrate including a thin film transistor according to an embodiment of the present invention, and FIG. 2 is a sectional view taken along line A1-A2 of FIG. 1.

Referring to FIGS. 1 and 2, the thin film transistor according to the embodiment of the present invention includes a gate 11, an active layer 13, a source electrode 21 and a drain electrode 22 which are formed on a substrate 1. The active layer 13 includes a source electrode contact region and a drain electrode contact region configured to be connected to the source electrode 21 and the drain electrode 22, respectively, and a semiconductor channel region arranged between the source electrode contact region and the drain electrode contact region. A conductive layer 25 is provided on the semiconductor channel region and the conductive layer 25 is spaced apart from the source electrode 21 and the drain electrode 22.

Since the conductive layer 25 is provided on the semiconductor channel region, when a voltage is applied to the gate 11, charges with a polarity opposite to charges of the gate 11 will be induced at a side of the conductive layer 25 close to the gate 11, and therefore an electric field is formed between the gate 11 and the conductive layer 25, thus enhancing the electric field in the active layer 13 to strengthen the conductivity of the semiconductor channel region and make the conductivity of the thin film transistor better.

A material of the active layer 13 may be any one of amorphous silicon, polycrystalline silicon, microcrystalline silicon, and oxide semiconductor.

Figure 3:
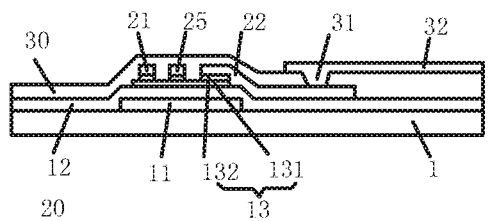
FIG. 3 is a schematic diagram of another structure of an array substrate including a thin film transistor according to an embodiment of the present invention.

FIG. 3 is a schematic diagram of another structure of an array substrate including a thin film transistor according to an embodiment of the present invention Referring to FIG. 3, this embodiment differs from the embodiment shown in FIG. 2 in that the active layer 13 includes a semiconductor layer 131 and an ohmic contact layer 132 provided on the semiconductor layer 131. The ohmic contact layer 132 is in contact with the source electrode 21, the drain electrode 22 and the conductive layer 25. The ohmic contact layer 132 facilitates the contact between the semiconductor layer 131 and the source electrode 21 and between the semiconductor layer 131 and the drain electrode 22.

Referring to FIGS. 2 and 3, the conductive layer 25 may be a metal conductive layer. The source electrode 21, the drain electrode 22, and the conductive layer 25 of the thin film transistor are provided in the same layer and made of the same material, and thus the source electrode 21, the drain electrode 22, and the conductive layer 25 may be formed at the same time through one process. In addition, it is possible to form the source electrode 21, the drain electrode 22, and the conductive layer 25 separately.

The material of the source electrode 21, the drain electrode 22, and the conductive layer 25 of the thin film transistor may be one or more materials selected from a group consisting of molybdenum (Mo), molybdenum niobium alloy (MoNb), aluminum (Al), aluminum neodymium alloy (AlNd), titanium (Ti) and copper (Cu).

Figure 4:
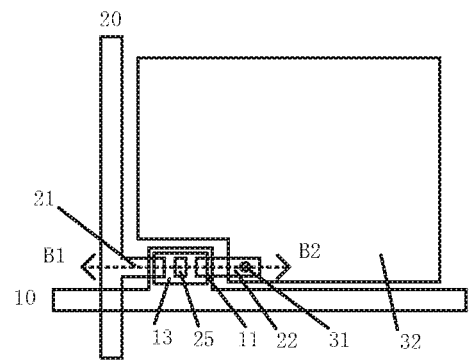
FIG. 4 is a schematic diagram of still another structure of an array substrate including a thin film transistor according to an embodiment of the present invention.
Figure 5:
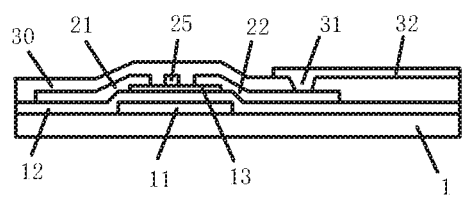
FIG. 5 is a sectional view taken along line B1-B2 of FIG. 4.
Figure 6:
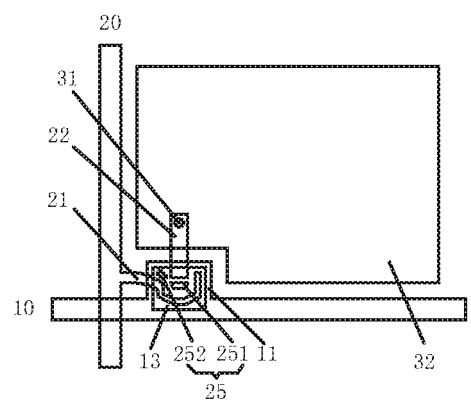
FIG. 6 is a schematic diagram of yet another structure of an array substrate including a thin film transistor according to an embodiment of the present invention.

FIG. 4 is a schematic diagram of still another structure of an array substrate including a thin film transistor according to an embodiment of the present invention, FIG. 5 is a sectional view taken along line B1-B2 of FIG. 4, and FIG. 6 is a schematic diagram of yet another structure of an array substrate including a thin film transistor according to an embodiment of the present invention.

The semiconductor channel region of the active layer 13 may be rectangle shaped or U-shaped. As shown in FIG. 4, the shape of the semiconductor channel region may be a rectangle. As shown in FIGS. 1 and 6, the shape of the semiconductor channel may be a U shape. In addition, the semiconductor channel region may be of other shape than the U shape and the rectangle.

Further, the conductive layer 25 may include one or more conductive parts.

Referring to FIGS. 4 and 5, a conductive part is provided on the semiconductor channel region of the active layer 13 and the conductive part is located between the source electrode 21 and the drain electrode 22 of the thin film transistor.

Referring to FIG. 6, the conductive layer 25 includes conductive parts 251 and 252 which are arranged in the same layer and spaced apart from each other. As shown in FIG. 6, the semiconductor channel region of the active layer 13 is of a U shape. The conductive part 251 is located on a central portion of the active layer 13 and between the drain electrode 22 and the source electrode 21, so as to strengthen the conductivity of the semiconductor channel region between the drain electrode 22 and the source electrode 21. The conductive part 252 is located at the upper-left corner of the active layer 13 and between the drain electrode 22 and the source electrode 21, so as to strengthen the conductivity of the semiconductor channel region at the upper-left corner of the active layer 13. The number and shape of the conductive part(s) are not limited in the embodiment of the present invention and may be set as required.

The thin film transistor may be a top-gate thin film transistor or a bottom-gate thin film transistor. When the thin film transistor is a top-gate thin film transistor, the gate 11 is arranged above the active layer 13 and is spaced apart from the active layer 13 by a gate insulation layer 12; when the thin film transistor is a bottom-gate thin film transistor, the gate 11 is arranged below the active layer 13 and is spaced apart from the active layer 13 by a gate insulation layer 12. The gate 11 may be a single layer or a multilayer laminate formed of one or more materials selected from the group consisting of molybdenum (Mo), molybdenum niobium alloy (MoNb), aluminum (Al), aluminum neodymium alloy (AlNd), titanium (Ti) and copper (Cu), for example, the gate 11 may be a single layer or a multilayer laminate formed of Mo, Al or an alloy containing Mo and Al. The gate insulation layer 12 may be a multilayer laminate formed of one or more materials selected from the group including silicon oxide (SiOx), silicon nitride (SiNx), hafnium oxide (HfOx), silicon oxynitride (SiON), aluminum oxide (AlOx) and the like.

The thin film transistor according to the present invention may be applied to various kinds of array substrates. A passivation layer 30 is provided on the thin film transistor, the drain electrode 22 of the thin film transistor according to the present invention is connected to a pixel electrode 32 through a via hole 31 penetrating through the passivation layer 30, the source electrode 21 is connected to a data line 20, and the gate 11 is connected to a gate line 10.

The array substrate including the thin film transistor according to the present invention may be applied to various display devices including, but not limited to, any products or components with a display function, such as a mobile phone, a tablet computer, a television, a display, a notebook computer, a digital photo frame, a navigator and the like.

It can be understood that, the above implementations are merely exemplary implementations used for explaining the principle of the present invention, but the present invention is not limited thereto. For a person skilled in the art, various modifications and improvements may be made without departing from the spirit and essence of the present inven-

The invention claimed is:

1. A pixel thin film transistor, comprising an active layer, a source electrode and a drain electrode, wherein,
the active layer comprises a source electrode contact region, a drain electrode contact region, and a semiconductor channel region arranged between the source electrode contact region and the drain electrode contact region, and
a conductive layer is provided on the semiconductor channel region and is spaced apart from the source electrode and the drain electrode,
wherein the semiconductor channel region is U-shaped when viewed in a plane view of the pixel thin film transistor, and the source electrode comprises a U-shaped part corresponding to the U-shaped semiconductor channel region,
wherein the conductive layer comprises at least one conductive part, and the at least one conductive part is arranged between one end of the drain electrode and the U-shaped part of the source electrode, and
wherein the active layer further comprises an ohmic contact layer, and the source electrode, the drain electrode and the conductive layer are in contact with the source electrode contact region, the drain electrode region and the semiconductor channel region through the ohmic contact layer, respectively.

2. The pixel thin film transistor according to claim 1, wherein, a material of the active layer is any one of amorphous silicon, polycrystalline silicon, microcrystalline silicon, and oxide semiconductor.

3. The pixel thin film transistor according to claim 1, wherein, the conductive layer is a metal conductive layer.

4. The pixel thin film transistor according to claim 1, wherein, the source electrode, the drain electrode, and the conductive layer are provided in the same layer and made of the same material.

5. The pixel thin film transistor according to claim 1, wherein, a material of the source electrode, the drain electrode, and the conductive layer is any one of molybdenum, molybdenum niobium alloy, aluminum, aluminum neodymium alloy, titanium and copper.

6. The pixel thin film transistor according to claim 1, further comprising a gate, which is arranged below the active layer and is spaced apart from the active layer by a gate insulation layer.

7. An array substrate, comprising the pixel thin film transistor according to claim 1.

8. The array substrate according to claim 7, wherein, a material of the active layer is any one of amorphous silicon, polycrystalline silicon, microcrystalline silicon, and oxide semiconductor.

9. The array substrate according to claim 7, wherein, the conductive layer is a metal conductive layer.

10. The array substrate according to claim 7, wherein, the source electrode, the drain electrode, and the conductive layer are provided in the same layer and made of the same material.

11. The array substrate according to claim 7, wherein, a material of the source electrode, the drain electrode, and the conductive layer is any one of molybdenum, molybdenum niobium alloy, aluminum, aluminum neodymium alloy, titanium and copper.

12. The array substrate according to claim 7, wherein the pixel thin film transistor further comprises a gate, which is arranged below the active layer and is spaced apart from the active layer by a gate insulation layer.

13. A display device, comprising the array substrate according to claim 7.

14. The display device according to claim 13, wherein, a material of the active layer is any one of amorphous silicon, polycrystalline silicon, microcrystalline silicon, and oxide semiconductor.

15. The display device according to claim 13, wherein, the source electrode, the drain electrode, and the conductive layer are provided in the same layer and made of the same material.

16. The display device according to claim 13, wherein, a material of the source electrode, the drain electrode, and the conductive layer is any one of molybdenum, molybdenum niobium alloy, aluminum, aluminum neodymium alloy, titanium and copper.

17. The display device according to claim 13, wherein the pixel thin film transistor further comprises a gate, which is arranged below the active layer and is spaced apart from the active layer by a gate insulation layer.

* * * * *